United States Patent
Hussell et al.

(10) Patent No.: US 7,910,938 B2
(45) Date of Patent: *Mar. 22, 2011

(54) ENCAPSULANT PROFILE FOR LIGHT EMITTING DIODES

(75) Inventors: Christopher P. Hussell, Cary, NC (US); Michael J. Bergmann, Chapel Hill, NC (US); Brian T. Collins, Raleigh, NC (US); David T. Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/839,603

(22) Filed: Aug. 16, 2007

(65) Prior Publication Data

US 2008/0054284 A1 Mar. 6, 2008

Related U.S. Application Data

(60) Provisional application No. 60/824,390, filed on Sep. 1, 2006.

(51) Int. Cl.
*H01L 33/48* (2010.01)

(52) U.S. Cl. .......... 257/98; 257/100; 257/E33.055; 257/E33.059; 257/E33.067

(58) Field of Classification Search .......... 257/79, 257/94, 98, 100, 95, E33.067, E33.068, E33.071, 257/E33.055, E33.059, E33.057
See application file for complete search history.

(56) References Cited

U.S. PATENT DOCUMENTS

| | | | |
|---|---|---|---|
| 6,257,737 B1 * | 7/2001 | Marshall et al. | 362/231 |
| 6,664,560 B2 | 12/2003 | Emerson et al. | |
| 6,734,033 B2 | 5/2004 | Emerson et al. | |
| 6,936,862 B1 | 8/2005 | Chang et al. | |
| 6,967,116 B2 | 11/2005 | Negley | |
| 7,042,020 B2 | 5/2006 | Negley | |
| 7,078,732 B1 | 7/2006 | Reeh et al. | |
| 7,246,923 B2 * | 7/2007 | Conner | 362/309 |
| 7,259,402 B2 | 8/2007 | Edmond et al. | |
| 2002/0063520 A1 | 5/2002 | Yu et al. | |
| 2004/0051111 A1 | 3/2004 | Ota et al. | |
| 2004/0100192 A1 | 5/2004 | Yano et al. | |
| 2004/0140765 A1 | 7/2004 | Takekuma | |

(Continued)

FOREIGN PATENT DOCUMENTS

DE 196 38 667 4/1998

(Continued)

OTHER PUBLICATIONS

Sep. 17, 2009 office action of German foreign counterpart application No. 10 2007 040 811.2.

(Continued)

*Primary Examiner* — Victor Mandala
*Assistant Examiner* — Scott Stowe
(74) *Attorney, Agent, or Firm* — Koppel, Patrick, Heybl & Dawson

(57) ABSTRACT

A light emitting packaged diode ids disclosed that includes a light emitting diode mounted in a reflective package in which the surfaces adjacent the diode are near-Lambertian reflectors. An encapsulant in the package is bordered by the Lambertian reflectors and a phosphor in the encapsulant converts frequencies emitted by the LED chip and, together with the frequencies emitted by the LED chip, produces white light. A substantially flat meniscus formed by the encapsulant defines the emitting surface of the packaged diode.

32 Claims, 2 Drawing Sheets

U.S. PATENT DOCUMENTS

| | | | |
|---|---|---|---|
| 2004/0164311 A1* | 8/2004 | Uemura | 257/99 |
| 2004/0170018 A1* | 9/2004 | Nawashiro | 362/244 |
| 2005/0145991 A1 | 7/2005 | Sakamoto et al. | |
| 2005/0167682 A1* | 8/2005 | Fukasawa | 257/79 |
| 2005/0219835 A1 | 10/2005 | Nagayama | |
| 2005/0221519 A1 | 10/2005 | Leung et al. | |
| 2005/0285494 A1 | 12/2005 | Cho et al. | |
| 2006/0060867 A1 | 3/2006 | Suehiro | |
| 2006/0060872 A1 | 3/2006 | Edmond et al. | |
| 2006/0060874 A1 | 3/2006 | Edmond et al. | |
| 2006/0060879 A1 | 3/2006 | Edmond et al. | |
| 2006/0065906 A1 | 3/2006 | Harada | |
| 2006/0102991 A1 | 5/2006 | Sakano | |
| 2006/0138937 A1 | 6/2006 | Ibbetson | |
| 2007/0037307 A1 | 2/2007 | Donofrio | |
| 2007/0092636 A1* | 4/2007 | Thompson et al. | 427/66 |
| 2008/0054279 A1 | 3/2008 | Hussell et al. | |

FOREIGN PATENT DOCUMENTS

| | | |
|---|---|---|
| DE | 697 02 929 | 2/2001 |
| DE | 10 2005 000 800 | 8/2005 |
| DE | 10 2005 013 265 | 12/2005 |
| DE | 10 2005 042 814 | 4/2006 |
| EP | 1 017 112 | 7/2000 |
| JP | 11-040858 | 2/1999 |
| JP | 2003-234511 | 8/2003 |

OTHER PUBLICATIONS

Sep. 17, 2009 office action of German foreign counterpart application No. 10 2007 040 841.4-33—a foreign counterpart of related co-pending U.S. Appl. No. 11/839,562.

Jun. 19, 2009 Office Action from Chinese Application No. 20070148326.9—a foreign counterpart application of related U.S. Appl. No. 11/839,562.

Oct. 14, 2009 office action of related co-pending U.S. Appl. No. 11/839,562.

Schubert, "Light-Emitting Diodes," Cambridge University Press, 2003; pp. 92-96.

Patent Abstracts of Japan, Publication No. 2005-311153, Date: Nov. 2, 2005.

Japanese Patent Application No. 2007-216811, Official Action, dated: Sep. 3, 2010.

* cited by examiner

ENCAPSULANT PROFILE FOR LIGHT EMITTING DIODES

BACKGROUND

This application claims priority from Ser. No. 60/824,390 filed Sep. 1, 2006 and from Ser. No. 11/739,307 filed Apr. 24, 2007.

The present invention relates to the geometry of encapsulant materials in light emitting diodes (LEDs) and particularly to the light pattern emitted from surface mount side view LEDs that produce white light.

Light emitting diodes represent a class of semiconductor materials in which the application of current across a p-n junction drives recombinations between electrons and holes with at least some of the recombinations generating photons. In accordance with well-understood principles of electronics and physics, the wavelength (and thus the frequency) of the photons is based upon the energy change of the recombination. In turn, the energy is defined or constrained by the bandgap of the semiconductor materials; i.e., the energy difference between the material's valence band and its conduction band.

As a result, the color emitted by an LED is largely defined by the material from which it is formed. Diodes formed of gallium arsenide (GaAs) and gallium phosphide (GaP) tend to emit photons in the lower energy red and yellow portions of the visible spectrum. Materials such as silicon carbide (SiC) and the Group III nitrides have larger bandgaps and thus can generate photons with greater energy that appear in the green, blue and violet portions of the visible spectrum as well as in the ultraviolet portions of the electromagnetic spectrum.

In some applications, an LED is more useful when its output is moderated or converted to a different color. In particular, as the availability of blue-emitting LEDs has greatly increased, the use of yellow-emitting phosphors that convert the blue photons has likewise increased. Specifically, the combination of the blue light emitted by the diode and the yellow light emitted by the phosphor can create white light. In turn, the availability of white light from solid-state sources provides the capability to incorporate them in a number of applications, particularly including illumination and as backlighting for color displays. In such devices (e.g., flat computer screens, personal digital assistants, and cell phones), the blue LED and yellow phosphor produce white light which is then distributed in some fashion to illuminate the color elements (often formed by liquid crystals, "LCDs").

In the present application, the term "white light" is used in a general sense. Those familiar with the generation of colors and of color perception by the human eye will recognize that particular blends of frequencies can be defined as "white" for precise purposes. Although some of the diodes described herein can produce such precise output, the term "white" is used somewhat more broadly herein and includes light that different individuals or detectors would perceive as having a slight tint toward, for example, yellow or blue.

In many conventional applications, the light emitting diode (which in its basic semiconductor structure is typically referred to as the chip), is packaged for its intended use. As used herein, the term package typically refers to the placement of the semiconductor chip on an appropriate electrical structure (sometimes as simple as a small piece of metal) along with a plastic lens (resin, epoxy, encapsulant) that provides some physical protection to the diode and can optically direct the light output.

In many conventional applications, the lens is at least partially formed of a hemisphere. An example is the classic T1 ¾ package which is widely recognized and is incorporated in a large number of LED applications.

More recently, light emitting diodes are being used for illumination purposes. In particular, LEDs that can produce white light are used for back lighting flat panel displays (computer screens, personal digital assistants, cellular telephones) via some other type of device (typically a liquid crystal) to generate or display color. In many of these applications, the LEDs are mounted perpendicular to the face of the relevant screen. In this orientation, and instead of being directed at the rear of the screen itself, the LEDs are directed towards the edges of a light guide—often a planar piece of plastic—so that when the light from the LEDs enters the edge of the light guide, the light guide in turn redirects it perpendicularly towards the plane of the display screen.

Light emitting diodes packaged for this purpose are referred to as side view surface mount LEDs or side lookers. Many surface mount side view diodes incorporate a concave meniscus within their housing. A concave meniscus can tend to focus light and yield a higher intensity, but at a cost of overall flux. Nevertheless, a concave meniscus also protects the encapsulant from mechanical damage (the encapsulant is generally more fragile than other portions of the package).

Side mount surface view LEDs that emit white light typically do so by incorporating a blue-emitting LED chip with a yellow-emitting phosphor. The blue light from the chip excites the phosphor to emit yellow light. This produces a combination of blue and yellow frequencies that together generate an appropriate hue of white light.

It has been discovered, however, that when a concave conventional meniscus is used in a side view surface mount LED in combination with certain higher brightness diodes, the concave shape of the encapsulant becomes a disadvantage because it may reduce both flux and color uniformity.

These disadvantages are particularly noticeable for chips with far field profiles that are more Lambertian than typical LEDs. Lambertian refers to the degree to which a surface adheres to the Lambert cosine law which states that the reflected or transmitted luminous intensity (flux) in any direction from an element of a perfectly diffusing surface varies as the cosine of the angle between that direction and the normal vector of the surface. The Lambert cosine law is often expressed as the formula $N=N0\cos A$, where N is the radiant intensity, N0 is the radiance normal to the emitting surface and A is the angle between the viewing direction and the normal to the emitting surface.

In practical terms, the emission from a Lambertian emitter is more uniform than that of a less-Lambertian or non-Lambertian emitter.

Accordingly, a concave meniscus tends to reduce or eliminate the far field advantages of those LEDs that produce nearly Lambertian far field patterns.

Accordingly, a need exists to complement the brightness and far field characteristics of high quality diodes with an appropriate lens or encapsulant shape that enhances, rather than hinders, the light output for the intended purpose.

SUMMARY

The invention is a light emitting packaged diode that includes an LED chip with a near-Lambertian far field pattern mounted in a reflective package in which the surfaces adjacent the diode are also near-Lambertian reflectors; an encapsulant in the package and bordered by the Lambertian reflectors; a phosphor in the encapsulant that converts frequencies emitted by the LED chip and that together with the frequencies emitted by the LED chip produce white light; and a substantially flat meniscus formed by the encapsulant that defines the emitting surface of the package diode.

The foregoing and other objects and advantages of the invention and the manner in which the same are accomplished will become clearer based on the followed detailed description taken in conjunction with the accompanying drawings.

DETAILED DESCRIPTION

Figure 1:
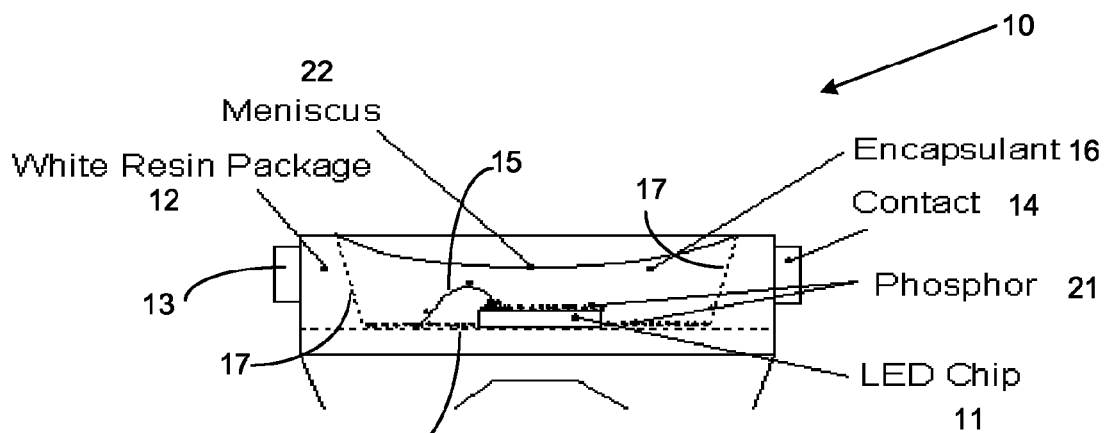
FIG. 1 is a cross-sectional diagram of a conventional side view surface mount light emitting diode.

FIG. 1 is a cross sectional view of a conventional light emitting diode of the type referred to as a surface mount side view diode. The diode is broadly designated at 10. The packaged diode 10 includes a light emitting diode chip 11 in a white resin package 12. Respective electrical contacts 13 and 14 are included for connecting the packaged diode 10 to a circuit or device. For the sake of clarity, FIG. 1 refrains from illustrating all of the wiring, but does include a wire 15 typically used to connect the chip 11 to one electrode while the chip itself rests on a second electrode (not shown). As in many such conventional packages, the chip 11 is covered by an encapsulant 16 that fills a recess defined by the walls 17 and floor 20 of the resin package 12. A phosphor for light conversion is indicated as the black dots 21.

In such a conventional package 10, the encapsulant forms a concave meniscus 22. As noted earlier, in such conventional diodes, the concave meniscus 22 can help focus the light in a particular direction, but may reduce the color uniformity. Nevertheless, this also reduces flux in exchange for higher directional intensity. The concave meniscus 22 also defines the encapsulant within the borders of the white resin package 12. This can help protect the encapsulant from physical contact with other objects and thus provides, at least to some extent, some physical protection to the diode 10.

Figure 2:
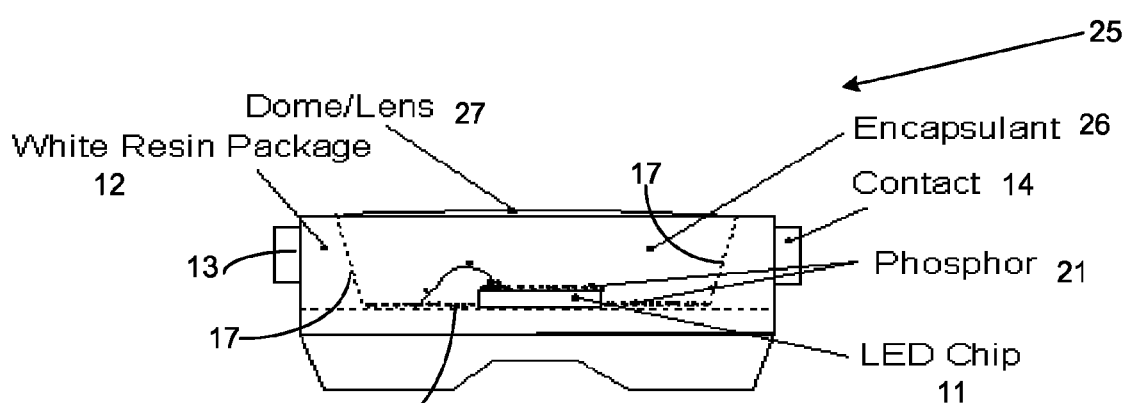
FIGS. 2, 3 and 4 are cross-sectional diagrams of side view surface mount light emitting diodes according to the present invention.

FIG. 2 illustrates a packaged diode 25 according to the present invention. Where identical, elements carry the same reference numerals as in FIG. 1. Accordingly, in the side view surface mount embodiment of FIG. 2, the diode 25 includes the white resin package 12, the LED chip 11, the respective contacts 13 and 14, and the recess in the package 12 defined by the side walls 17 and the floor 20. The walls 17 and floor 20 of the package 12 are preferably near-Lambertian in their reflection characteristics. The white resins used for such packages are widely available and well understood in this art and will not be otherwise discussed in detail.

In FIG. 2 the encapsulant is designated at 26 because it carries a different shape from the conventional meniscus illustrated in FIG. 1. In particular, in the invention the encapsulant is formed into a substantially flat lens 27. The latter design provides advantages during manufacturing, better far field uniformity, and a greater luminant flux.

The encapsulant can be any material that is suitable for the purposes of the invention and that does not otherwise interfere with the operation of the chip. As set forth in co-pending and commonly assigned application Ser. No. 60/824,385 filed Sep. 1, 2006 for, "Phosphor Position In Light Emitting Diodes," when the LED chip emits in the higher energy portions of the spectrum (e.g., blue, violet, and ultraviolet), the encapsulant should be less reactive or inert to the photons emitted at such frequencies. Thus, the polysiloxane ("silicone") resins tend to be particularly well suited for the encapsulant.

Although the inventors do not wish to be bound by any theory, it has been discovered that the use of the flat or lens 27 complements and enhances chips with Lambertian or near-Lambertian far field characteristics such as the EZBRIGHT™ and EZR™ LED chips available from Cree Inc., Durham N.C., the assignee of the present invention.

The incorporation of phosphors is well understood in the art and will not be discussed in detail herein. For blue light emitting diodes cerium-doped yttrium-aluminum-garnet (YAG:Ce) is one example of a phosphor material that is appropriate because it is responsive to the higher energy frequencies and emits yellow frequencies in response. As noted earlier herein, the combination of these blue and yellow frequencies can produce appropriate shades of white light.

Figure 3:
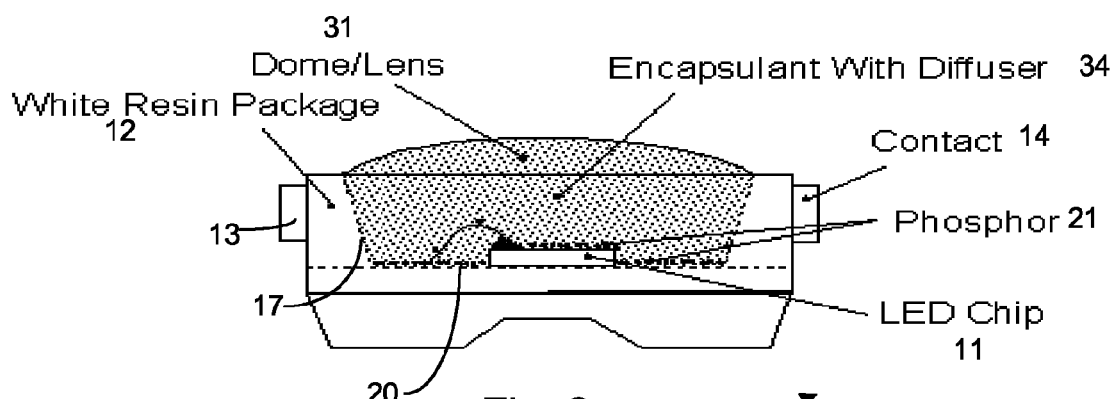

FIG. 3 illustrates another embodiment of the invention. Again and where appropriate, like reference numerals will identify identical elements. In FIG. 3 the packaged diode is broadly designated at 30 and includes the LED chip 11 in the white resin package 12. In FIG. 3, however, the encapsulant is designated at 34 and is formed into a moderate dome lens 31. It has been discovered that a very slight meniscus (convex or concave) that is maintained within about 50 microns of the top surface 32 of the white resin package 12 still offers the uniformity benefits of the flat surface illustrated in FIG. 2. The 50 micron dimension is defined between the highest (or lowest) portion of the meniscus 33 and the top surface 32 of the white resin package 12. As a proportional comparison, the package 12 will have dimensions on the order of about 2-4 millimeters in length, width and height.

It has further been discovered according to the invention that radiation mixing with the dome lens 31 can be enhanced with a light diffuser indicated by the dots in the encapsulant 34. Generally speaking, a diffuser is any set of physical objects, potentially including bubbles in the encapsulant, that physically scatter light within the encapsulant 34.

FIGS. 2 and 3 illustrates that the phosphor 21 is preferably positioned immediately upon or very close to the chip 11 and the floor 20 of the white resin package 12. The method for positioning of the phosphor in this manner is set forth in previously incorporated application No. 60/824,385 for Phosphor Position in Light Emitting Diodes.

Figure 4:
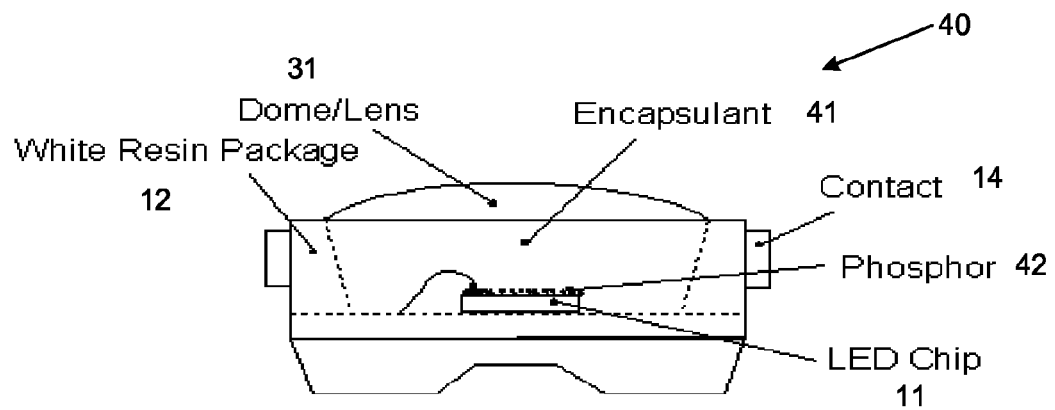

FIG. 4 is a cross-sectional view of a diode 40 according to the present invention that is similar to FIG. 3 with respect to the dome lens 31. In FIG. 4, however, the encapsulant is designated at 41 because it does not include the diffuser. The phosphor is designated at 42 because it covers only the emissive area of the chip 11. Limiting the position of the phosphor 42 in this manner permits the dome lens 31 to be somewhat larger while still producing good color uniformity.

Light extraction and thus efficiency can be optimized with such a modest dome 31 (FIGS. 3 and 4) and modest domes can offer the benefit of focusing the light in a particular direction while defocusing it in others. This in turn maximizes coupling into planar components such as the light guides that are used as part of the backlighting unit for flat displays, particularly including those that include liquid crystals. In such applications, the invention offers the capability of focusing the light tightly within the plane of the light guide while spreading it across the plane for maximum efficiency and uniformity.

Figure 5:
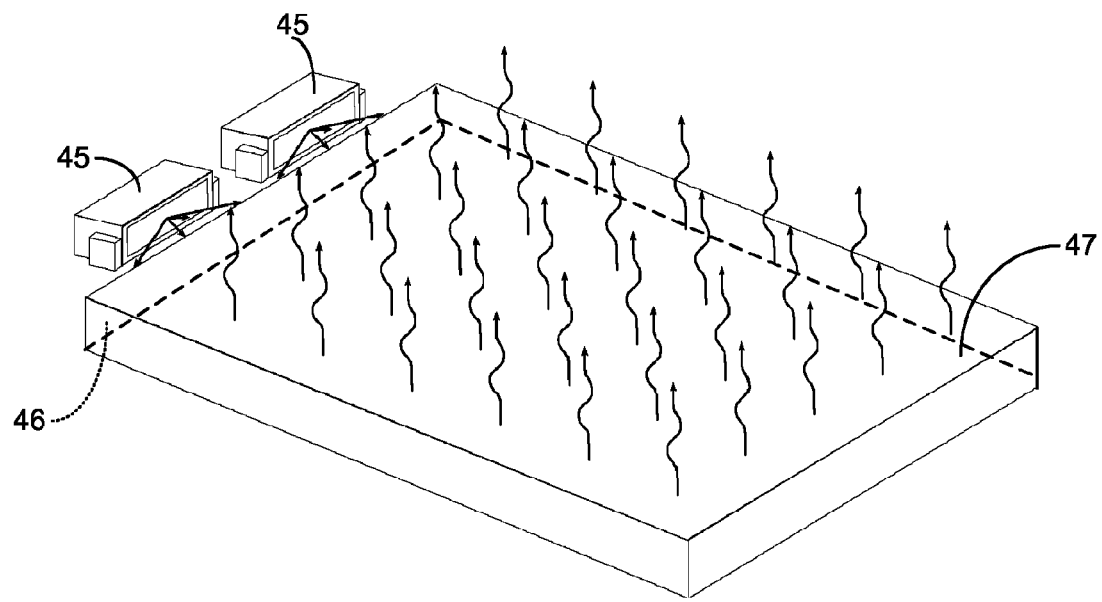
FIG. 5 is a perspective view of diodes according to the present invention in conjunction with a light guide.

FIG. 5 illustrates this concept is in which two diodes, according to the present invention (each designated at 45) are positioned along a rear edge 46 of a light guide 47. As indicated by the vector arrows 50, the slightly domed meniscus (31 in FIGS. 3 and 4) can produce more light in the predominant plane of the light guide 47 while avoiding wasting light above and below that plane, thus increasing the efficiency of the combination of the diodes 45 and the light guide 47.

FIG. 5 also illustrates the fact some embodiments, a side view surface mount diode is characterized by a rectangular profile rather than a square or circular profile. In such cases, the light emitting surface of the moderately domed encapsulant forms an arc-shaped profile that extends in the direction of primary emission and, as further illustrated by FIG. 5, toward the edge of the light guide that the diode is intended to illuminate.

In such cases, if the encapsulant were to be viewed individually, the extent to which it extended from the plane of the white resin package (e.g. 12 in FIGS. 1-4) would define a solid polygon with one rectangular side, two arc shaped planes perpendicular to the rectangular side and a vertical curved wall extending from end to end of the rectangular side and following the arc of the two arc-shaped planes. This distinguishes the domes of the present invention from hemispheres or other partial spheres that are more typical in surface mount LEDs and in surface mount side view LEDs.

It will be understood that the dome lens 31 or flat lens 27 according to the invention need not be formed in a single step. Because variations in the manufacture of the meniscus 27, 31 are almost inevitable, initial variability in the color point, color uniformity, intensity, and far field profile (or any combination of these) can result. For example, variations as small as 10 microns in the height or position of the encapsulant 10 can define the difference between useful and failed diodes. Accordingly, in the invention the encapsulant can be reworked by successive applications of thin layers of additional encapsulant until the desired characteristics are produced.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A light emitting packaged diode comprising:
a light emitting diode chip mounted in a reflective package in which the surfaces of the reflective package adjacent said diode are near-Lambertian reflectors;
an encapsulant in said package and bordered by said near-Lambertian reflectors;
a phosphor in said encapsulant that converts frequencies emitted by said chip and that together with the frequencies emitted by said chip produces white light; and
a domed meniscus that does not exceed 50 microns from said reflective package, said meniscus formed by said encapsulant and said package, said meniscus defining the emitting surface of said packaged diode.

2. A packaged diode according to claim 1 comprising a light emitting diode chip with a near-Lambertian far field pattern.

3. A packaged diode according to claim 1 wherein said encapsulant comprises a plurality of layers of said encapsulant.

4. A light emitting packaged diode according to claim 1 wherein said light emitting diode is formed from the Group III nitride material system.

5. A light emitting packaged diode according to claim 1 wherein said phosphor comprises cerium doped yttrium aluminum garnet.

6. A light emitting packaged diode according to claim 1 wherein said reflective package comprises a white resin.

7. A light emitting packaged diode according to claim 1 wherein said encapsulant includes a diffuser.

8. A light emitting packaged diode according to claim 1 wherein said encapsulant comprises a polysiloxane resin.

9. A display that incorporates the packaged diode of claim 1 in a side view surface mount orientation in combination with a light guide.

10. A light emitting packaged diode comprising:
a light emitting diode chip mounted in a side view surface mount reflective package in which the surfaces of the reflective package adjacent said diode are near-Lambertian reflectors;
an encapsulant in said package and bordered by said near-Lambertian reflectors;
a phosphor in said encapsulant that converts frequencies emitted by said chip and that together with the frequencies emitted by said chip produces white light; and
a domed meniscus that does not exceed 50 microns from said reflective package, said meniscus formed by said encapsulant and said package, said meniscus defining the emitting surface of said packaged diode.

11. A packaged diode according to claim 10 comprising a light emitting diode with a near-Lambertian far field pattern.

12. A packaged diode according to claim 10 wherein said encapsulant comprises a plurality of layers of said encapsulant.

13. A light emitting packaged diode according to claim 10 wherein said light emitting diode is formed from the Group III nitride material system.

14. A light emitting packaged diode according to claim 10 wherein said phosphor comprises cerium doped yttrium aluminum garnet.

15. A light emitting packaged diode according to claim 10 wherein said reflective package comprises a white resin.

16. A light emitting packaged diode according to claim 10 wherein said encapsulant includes a diffuser.

17. A light emitting packaged diode according to claim 10 wherein said encapsulant comprises a polysiloxane resin.

18. A light emitting packaged diode according to claim 10 wherein said phosphor is positioned to cover only the emissive area of said chip.

19. A lighted display comprising:
a light guide;
at least one packaged light emitting diode along one edge of said light guide;
said packaged diode including,
a reflective package with near-Lambertian reflectors,
a light emitting diode chip in said reflective package,
an encapsulant in said package and covering said chip,
a phosphor in said encapsulant that converts frequencies emitted by said chip and that together with the frequencies emitted by said chip produce white light, and
a domed meniscus that does not exceed 50 microns from said reflective package, said meniscus formed by said encapsulant and said package, said meniscus defining the emitting surface of said packaged diode against the edge of said light guide.

20. A lighted display according to claim 19 wherein said packaged diode is a side view surface mount package with a rectangular profile with the light emitting surface of said domed encapsulant forming an arc-shaped profile that extends in the direction of primary emission of said chip and toward said edge of said light guide.

21. A lighted display according to claim 19 wherein said diode chip is formed from the Group III nitride material system.

22. A lighted display according to claim 19 wherein said reflective package is a white polymer resin.

23. A lighted display according to claim 19 including at least two packaged light emitting diodes along at least one edge of said light guide.

24. A lighted display according to claim 23 wherein said light guide is rectangular and has substantially planar dimensions.

25. A lighted display according to claim 19 wherein said encapsulant is a polysiloxane resin.

26. A lighted display according to claim 19 wherein said phosphor comprises cerium-doped yttrium aluminum garnet.

27. A light emitting packaged diode according to claim 1, wherein:
said package defines a top surface; and
said meniscus is maintained within 50 microns of a plane defined by the top surface of said package.

28. A light emitting packaged diode according to claim 10, wherein:
said package defines a top surface; and
said meniscus is maintained within 50 microns of a plane defined by the top surface of said package.

29. A lighted display according to claim 19, wherein:
said package defines a top surface; and
said meniscus is maintained within 50 microns of a plane defined by the top surface of said package.

30. A packaged diode according to claim 1 wherein said domed meniscus does not exceed 50 microns from a top surface of said reflective package.

31. A packaged diode according to claim 10 wherein said domed meniscus does not exceed 50 microns from a top surface of said reflective package.

32. A lighted display according to claim 19 wherein said domed meniscus does not exceed 50 microns from top surface of said reflective package.

* * * * *